United States Patent
Pelletier

(10) Patent No.: US 9,238,864 B2
(45) Date of Patent: Jan. 19, 2016

(54) CONTROLLED COATING APPARATUS, SYSTEMS, AND METHODS

(75) Inventor: Michael T. Pelletier, Houston, TX (US)

(73) Assignee: Halliburton Energy Services, Inc., Houston, TX (US)

( * ) Notice: Subject to any disclaimer, the term of this patent is extended or adjusted under 35 U.S.C. 154(b) by 547 days.

(21) Appl. No.: 13/416,497

(22) Filed: Mar. 9, 2012

(65) Prior Publication Data
US 2013/0233449 A1 Sep. 12, 2013

(51) Int. Cl.
| | |
|---|---|
| *C23C 8/04* | (2006.01) |
| *C23C 8/06* | (2006.01) |
| *C23C 22/48* | (2006.01) |
| *C23C 16/04* | (2006.01) |
| *C23C 16/52* | (2006.01) |
| *C23C 16/455* | (2006.01) |
| *C23C 22/00* | (2006.01) |

(52) U.S. Cl.
CPC ............ *C23C 16/042* (2013.01); *C23C 16/045* (2013.01); *C23C 16/45555* (2013.01); *C23C 16/52* (2013.01)

(58) Field of Classification Search
CPC .......... C23C 22/00; C23C 22/48; C23C 8/04; C23C 8/06
USPC ........................................................ 148/280
See application file for complete search history.

(56) References Cited

U.S. PATENT DOCUMENTS

| | | | | |
|---|---|---|---|---|
| 5,480,677 | A | * | 1/1996 | Li et al. ...................... 427/248.1 |
| 5,795,409 | A | * | 8/1998 | Hirao et al. .................... 148/269 |
| 6,444,054 | B1 | * | 9/2002 | Kircher et al. ................ 148/248 |
| 6,511,760 | B1 | | 1/2003 | Barone et al. |
| 7,070,833 | B2 | | 7/2006 | Smith et al. |
| 7,867,627 | B2 | | 1/2011 | Smith et al. |
| 2005/0257856 | A1 | * | 11/2005 | Jacksier et al. ............... 148/279 |

OTHER PUBLICATIONS

"Brief Overview of Microsystems and Nanoelectronics", [online]. [archived on Jun. 15, 2010]. Retrieved from the Internet: <URL: http://web.archive.org/web/20100615013006/ http://microlab.berkeley.edu/text/seminars/slides/VTT_ALD.pdf>, *Seminar Presentation at UC Berkeley*, (Jan. 30, 2010), 76 pgs.

"Corrosion protection", [online]. [retrieved on Dec. 16, 2011]. Retrieved from the Internet: <URL: http://www.picosun.com/applications/corrosion_protection.php, Copyright © 2011 Picosun, 1 pg.

(Continued)

*Primary Examiner* — Lois Zheng
(74) *Attorney, Agent, or Firm* — Schwegman Lundberg & Woessner, P.A.; Benjamin Fite

(57) ABSTRACT

Apparatus and systems may operate to provide a first reactant as a gas that flows under reduced atmospheric pressure to interact with a surface, such as a tool body surface, the interaction confined to a passage within the tool body, wherein the passage includes the surface and extends without interruption from an entrance end of the passage to an exit end of the passage. Additional activity may include providing a second reactant as a gas under the reduced atmospheric pressure, subsequent to the first reactant, to interact with the surface of the tool body; and repeated provision of the first and second reactants until a selected coating thickness on the surface is formed. Additional apparatus, systems, and methods are disclosed.

13 Claims, 6 Drawing Sheets

(56) References Cited

OTHER PUBLICATIONS

"MOCVD, CVD & ALD Precursors", © 2011 Strem Chemicals, Inc. [online]. Retrieved from the Internet: <URL: http://www.strem.com/uploads/resources/documents/mocvd.pdf>, (2011), 60 pgs.

"Picosun—Atomic Layer Deposition", (Jul. 27, 2009), 29 pgs.

"Spectroscopic Ellipsometry for ALD Technology", *Issue 10, J. A. Woollam Co., Inc. Newsletter Article*. [online]. [retrieved on Jan. 17, 2012]. Retrieved from the Internet: <URL:http://www.jawoollam.com/Newletters/Applications/se_for_ald.pdf>, (Jan. 2009), p. 7.

Hausmann, D. M., "Atomic layer deposition of metal oxide thin films", (Abstract Only). *Ph.D. Thesis, Harvard University, 2002, Dissertation Abstract International*, vol. 63-10, Section B, (2002), 2 pgs.

Becker, Jill S., "Atomic Layer Deposition of Metal Oxide and Nitride Thin Films", Thesis (Ph.D.), Department of Chemistry and Chemical Biology, Harvard University, (Dec. 2002), 165 pgs.

George, Steven M., "Atomic Layer Deposition: An Overview", *Chem. Rev., 110*, (2010), 111-131.

Sneh, Ofer, et al., "Thin film atomic layer deposition equipment for semiconductor processing", *Thin Solid Films, 402(1-2)*, (2002), 248-261.

Suntola, Tuomo, "Chapter 14—Atomic Layer Epitaxy", *In: Handbook of Crystal Growth, 3; Thin Films of Epitaxy, Part B: Growth Mechanisms and Dynamics*, Elsevier Science B.V., Amsterdam, The Netherlands, (1994), 601-663.

\* cited by examiner

CONTROLLED COATING APPARATUS, SYSTEMS, AND METHODS

BACKGROUND

Understanding the structure and properties of geological formations can reduce the cost of drilling wells for oil and gas exploration. Measurements made in a borehole (i.e., down hole measurements) are typically performed to attain this understanding, to identify the composition and distribution of material that surrounds the measurement device down hole. To obtain such measurements, a variety of sensors housed in down hole tools are used. Since the down hole environment is relatively harsh (e.g., as compared to a laboratory), these tools are often subject to corrosion and other destructive influences.

DETAILED DESCRIPTION

Geological inspection tools deployed down hole are subject to banging, bumping, twisting, scratching, and other physical abuse, as well as interaction with a variety of elements, including chemical compositions used for drilling. These environmental influences often combine to destroy tool surfaces and surface coatings.

The result of this interaction with the environment can be an abrasive surface, and/or one that is exposed and operates to short conductive electrical pathways. Various embodiments of the invention can operate to provide a substantially holiday free coating on down hole tool surfaces, which are physically large, and sometimes difficult to access (e.g., the electrical or hydraulic passages within a tool). For the purposes of this document, a "substantially holiday free coating" means a coating formed from at least three atomic monolayers. For example, three to seven monolayers of coating can be useful for preventing corrosion, and shorting/arcing via electrical conduction. Thus, in some embodiments, the coating process is deemed complete when the coating comprises a substantially holiday free coating.

These coatings can thus be used to help prevent chemical interaction between environmental fluids and tool metallurgy, as well as arcing in the presence of conductive elements. These coatings can also be used to increase the surface hardness of the tools, to prevent wear from abrasive slurries and other environmental elements.

The process of atomic layer deposition (ALD) uses self-limiting chemical reactions to build up layers of coating material in a controlled manner. Each layer may be constructed using two reactant components which are alternately applied from the gas phase. This process is sometimes used to build semiconductor components, and is applied in a vacuum chamber where all surfaces are coated, because any surface exposed to the gas phase can interact with the gas phase.

The use of commercially available vacuum chambers is limiting in a number of ways. In particular, large components cannot be treated because they will not fit into the chamber. The cost of building a chamber of suitable size to coat an entire down hole tool is cost-prohibitive.

As part of experimenting with various embodiments, the inventor has discovered that tool body surfaces can be coated using an ALD process, with the interior surfaces of the tool body itself being used as the reactor. The process can be tailored to treat only the required surfaces. Process temperatures are relatively low in comparison to heat treating, so that the design properties of the tool body matrix material will not be changed by the coating process. Indeed, the coating process conditions are usually within tool operating temperatures. Thus, various embodiments are well suited for the application of a protective coating to down hole tool surfaces.

Figure 1:
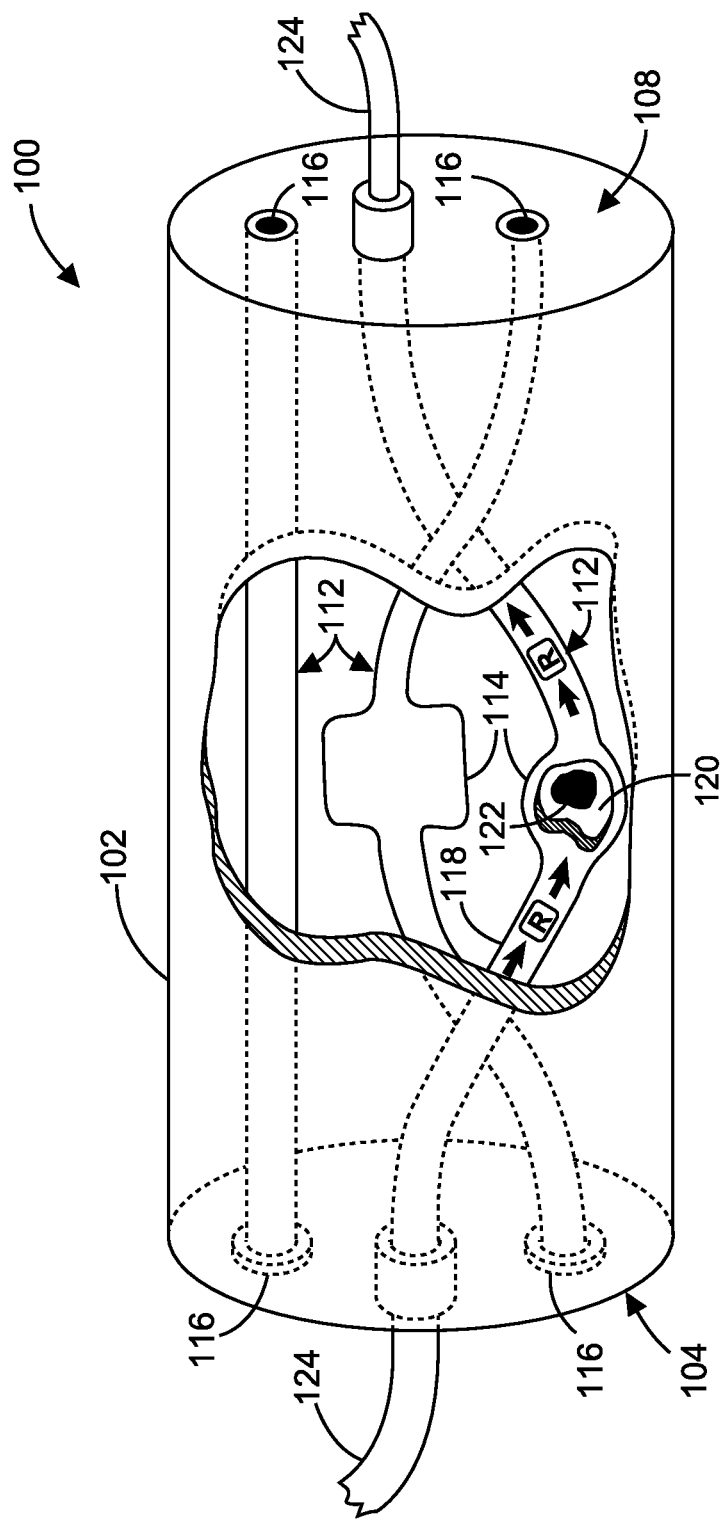
FIG. 1 is a front, cut-away view of an apparatus used in some embodiments of the invention.

FIG. 1 is a front, cut-way view of an apparatus 100 used in some embodiments of the invention. In this case, the apparatus 100 represents a down hole tool with several passages 112 that are entirely contained within the tool body 102, which may comprise metal.

Any number of passages 112 may exist in the tool body 102. For example, a first passage 112 might comprise a reservoir fluid path, a second passage 112 might comprise an electrical wiring path, and a third passage 112 might comprise a hydraulic fluid path. The passages 112 may be substantially straight, or sinuous. Passages 112 may include variations 114 that provide an intricate intersection of irregular interior passage surfaces 120. Examples of these different types of passages 112, and their variations 114, are shown in the figure.

Different passages 112 might be coated with correspondingly different coatings. To apply a coating 122 to the interior surface 120 of a selected passage 118, the ends of the selected passage 118 can be coupled to flow tubes 124 at an entrance end 104 and an exit end 108 of the passage 118, so that reactant R entering and leaving the passage 118 via the flow tubes 124 can interact with the interior surface 120 of the passage 118 that might otherwise be difficult to access. Passages 112 that are not to be coated can be masked, or sealed off using end caps 116.

Thus, to coat a selected passage 118, quantities of reactants R (e.g., a first reactant followed by a second reactant) may be provided to form the coating 122 on the surface 120. Providing a quantity of an individual reactant R may comprise directing the flow of some amount of the reactant R as a gas through the selected passage 118 disposed within the tool body 102 over some selected amount of time.

Some reactions between the selected reactant R and the surface 120 may be effective at or above atmospheric pressure. In some embodiments, the temperature of the tool body 102 is changed to modify the pressure within the selected passage 118 so that the reactant provided is in the gas phase.

Figure 3:
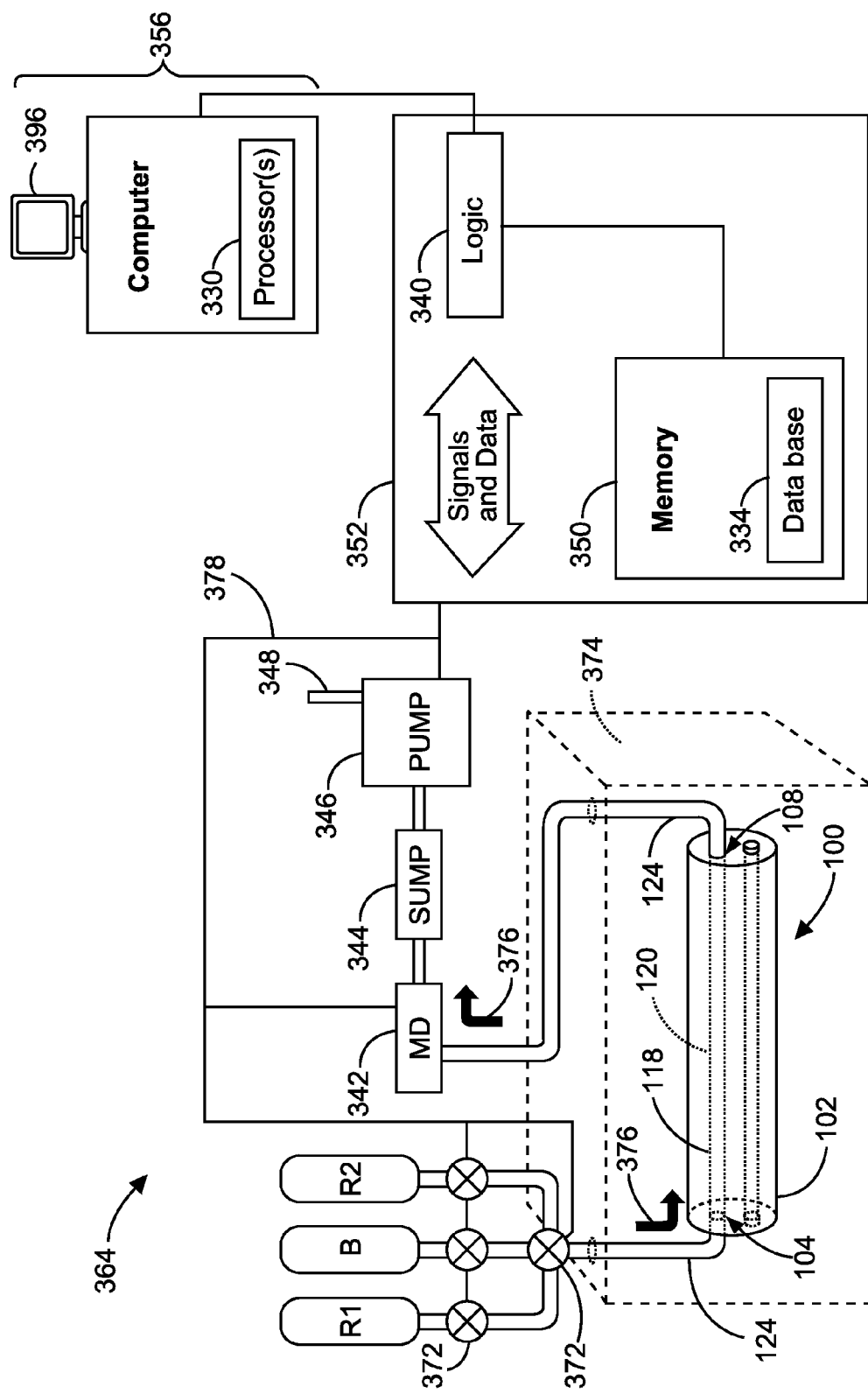
FIG. 3 illustrates apparatus, systems, and an oven according to some embodiments of the invention.
Figure 4:
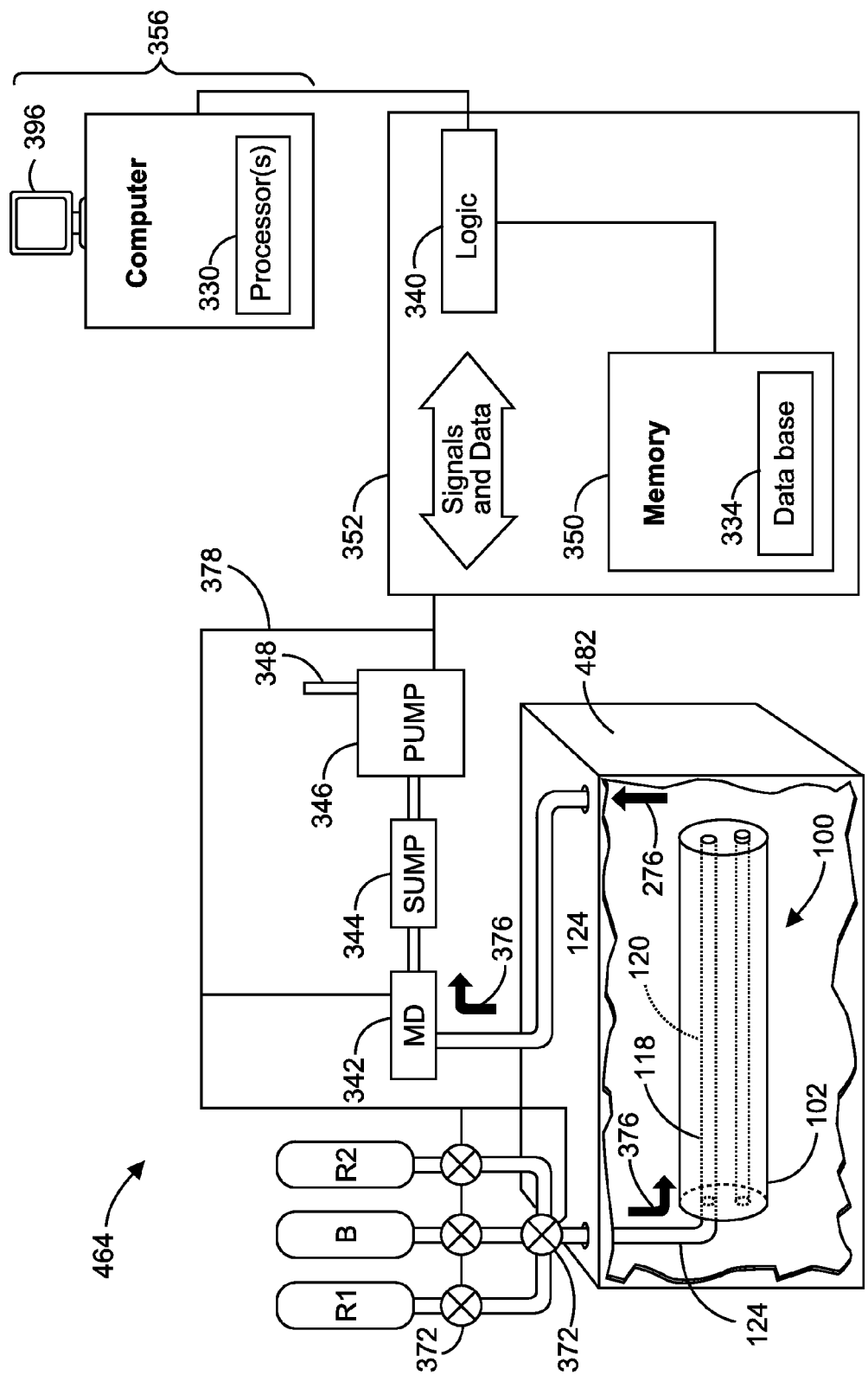
FIG. 4 illustrates apparatus, systems, and a vacuum chamber according to various embodiments of the invention.

The reactant R may be mixed in a diluting gas to bring the reactant out of the liquid phase and into the gas phase. For example, water is relatively stable at 25 C. Bubbling nitrogen through the water at 25° C. can bring the water up into the gas phase, where maximum dilution is usually driven by the temperature of the liquid phase. The liquid-gas system can be further diluted with gas to attain a reactant R concentration below saturation (usually at about 50% relative humidity). The original gas stream (e.g., coupled to the flow tube 124, and stored in an external tank, as shown in FIGS. 3 and 4) should not be permitted to encounter cold spots, defined as temperatures below the bubbler temperature, since the undiluted gas may condense, leading to poor coating uniformity. Diluted liquid-gas systems will generally tolerate cooler temperatures before condensing.

In some embodiments, coating methods include the activities of masking the surface 120 to prevent coating selected areas of the surface 120, and etching the coating that has been applied. Generally, all exposed surfaces 120 within the selected passage 118 are coated (assuming an excess of each gas phase reactant is provided).

Figure 2:
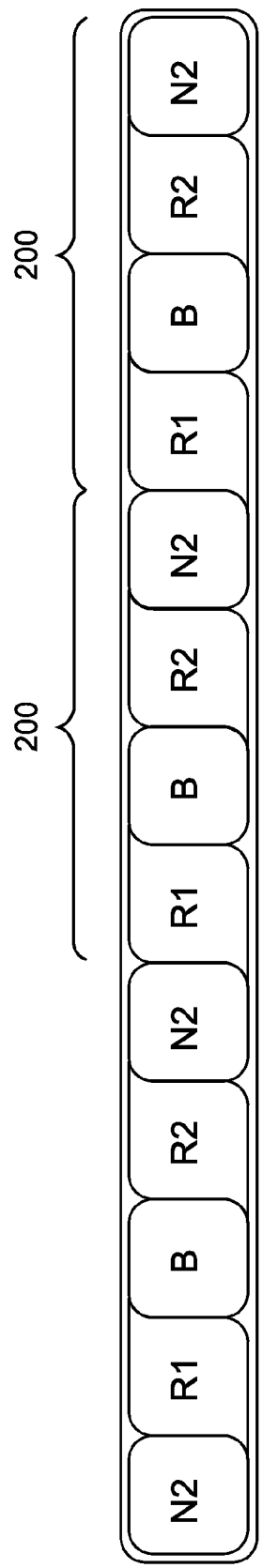
FIG. 2 illustrates the repeated use of reactant-buffer groups according to some embodiments of the invention.

FIG. 2 illustrates the repeated use of reactant-buffer groups 200 according to some embodiments of the invention. A buffer serves to help prevent the reactants from mixing in the gas phase and reacting with each other. Here reactants R1, R2 are separated by buffers B and N2, which may comprise nitrogen, and all of the components are provided in a train of gas components, as part of the group 200. In some embodiments, the same buffer B is used to separate the reactants R1, R2. In some embodiments (as shown here), a buffer B of one composition follows the introduction of reactant R1, and a buffer N2 of another composition follows the introduction of reactant R2.

In an example embodiment, reactant R1 (e.g., an organometallic compound, such as methyl aluminide) is added at the entrance end of a passage in a tool body until a response indicating the presence of the reactant R1 is detected at a quartz micro balance (QMB) coupled to an exit end of the passage. The supply of reactant R1 is then cut off In many embodiments, processes operate at a "reduced atmospheric pressure", which for the purposes of this document means a pressure within a range from just under atmospheric pressure (e.g., less than 760 torr), to about 20 microns of vacuum.

A purge buffer, such as a quantity of nitrogen (e.g., N2) is then added to the passage. Afterward, a relatively small quantity of reactant R2 (e.g., water vapor or hydrogen peroxide) is released into the entrance end of the passage, in an amount that is insufficient to totally coat the surface of the passage. Additional quantities of reactant R2 are then released, until a response is rendered by the QMB. The sum of the quantities of reactant R2 at this point is the total amount used to create a layer of the coating on the surface of the passage. To apply another layer, the total quantity of reactant R1 previously applied is again released into the passage, perhaps increased by a small amount (e.g., about 5% to about 15% more than is required to coat the surface). This produces a more rapid and complete reaction by reducing the concentration depletion caused by transverse diffusion at the edge of the buffer, which exhibits a concentration gradient driven by diffusion and dispersion as it travels down the passage.

The amount of purge buffer gas B, N2 to use between reactants R1, R2 can be determined by measuring the density of the gas leaving the exit end of the passage. As the initial reactant R1 is blown out by the buffer B, the concentration of each component at the exit end of the passage will affect the density of the result. The transition time from pure reactant R1 to pure buffer B, and the transition time from pure buffer B to reactant R2, added together, gives the minimum amount of buffer B to use in terms of time, for a given flow rate. An excess of 10% above this minimum amount may be useful in some embodiments. Flow rate will drive dispersion, so that larger amounts of buffer gas will be used at higher flow rates.

As a buffer gas, Nitrogen is plentiful and generally not a participant in the chemistries of the reactants. Any inert gas can be used as a buffer, such as helium, neon, xenon, and argon, as long as there is little or no reaction with the base material to be coated, or the reactant chemistries.

Once the quantities of reactant R1, buffers B, N2, and reactant R2 are known, the process of adding groups 200 of the reactants R1, R2 and buffers B, N2 to the passage can be repeated to build up any desired number of layers. For example, in some embodiments, a coating thickness of 100 angstroms may take approximately 40 minutes to develop, with individual reaction cycles (e.g., the time of release for a given reactant) being on the order of about one to about ten seconds.

In some embodiments, the reactant R1 comprises a silane, and the reactant R2 comprises methane or carbon monoxide. In some embodiments, the composition of reactants R1 and R2 are the same. The composition of the coating applied to the surface of a tool body passage depends on the composition of the reactants and the tool body itself. Thus, coating chemistries include oxides, such as aluminum oxide (e.g., $Al_2O_3$, $Al_2O_3$), nitrides, and metals.

Therefore, in some embodiments, a metallic tool body may be coated with an oxide. In this case, the tool body comprises metal, and the coating comprises an oxide. In this way, a variety of embodiments may be realized.

For example, FIG. 3 illustrates apparatus 100, systems 364, and an oven 374 according to some embodiments of the invention. FIG. 4 illustrates apparatus 100, systems 464, and a vacuum chamber 482 according to various embodiments of the invention.

Depending on the system 364, 464 chosen to coat tool body surfaces, passages within the tool body 102 may have two closed ends (e.g., both ends connected to flow tubes 124, as shown in FIG. 3), or a closed end and an open end (e.g., one end connected to a flow tube 124, and the other left open, as shown in FIG. 4).

In each case, the reactants R1, R2 (and/or a buffer B) travel along a path 376 defined in part by one or more passages in the tool body 102, and the flow tubes 124. The apparatus 100 may comprise a down hole tool installed as a section or as a single sub in an oven 374, such as a dispatch test oven. One or more gas injection valves 372 can be used to control the introduction of the reactants R1, R2 and buffer B into the entrance end 104 of a passage 118 in the tool body 102, and a measurement device "MD" 342 is used to detect the presence of the reactants R1, R2 (and perhaps the buffer B) at the exit end 108 of the passage 118 in the tool body 102.

In some embodiments, the measurement device 342 is directly coupled to the exit end 108 of the passage 118 (see FIG. 3). In some embodiments, the measurement device 342 is indirectly coupled to the exit end 108 of the passage 118 (see FIG. 4).

The measurement device 342, which may comprise a QMB, may be coupled to a sump (e.g., a reaction screen sump comprising steel wool in a pipe) 344 and a vacuum pump 346.

In some embodiments, the systems 364, 464 comprise one or more processors 330, memory 350, and data acquisition logic 340. The logic 340 and memory 350 may form part of a data acquisition system 352.

The memory 350 can be used to store acquired data, process recipes, and other data (e.g., in a database 334). The memory 350 is communicatively coupled to the processor(s) 330.

The vacuum pump 346 can be used to move the reactants R1, R2 and buffer B through the apparatus 100. Thus, the systems 364, 464 may further comprise the pump 346 to move the reactants R1, R2 and buffer B through the apparatus 100, via the flow tubing 124.

In some embodiments, the system 364 may comprise a display 396 to display information regarding the coating process, including coating thickness and other data that may be obtained from the measurement device 342. The processor(s) 330 may be used to control the flow of the reactants R1, R2 and buffer B via one or more valves 372 along the path 376 that extends from the containers of the reactants R1, R2 and buffer B through the apparatus 100, and onward through the measurement device 342, the sump 344, the pump 352, and the exhaust 348. Thus, the processor(s) 330, coupled to the signal and data lines 378, which are coupled in turn to the valves 372, measurement device 342, and pump 346, may be used to effect this control.

Thus, referring now to FIGS. 1-4, it can be seen that a wide variety of apparatus and systems may be realized. For example, a system 364, 464 may comprise a plurality of valves 372 to control the flow of reactants R1, R2, a measurement device to indicate surface coating thickness, and a vacuum pump 346 to move the reactants R1, R2 along a selected passage 118 within the tool body 102, to interact with a surface 120 defined by the passage 118.

In some embodiments, a system 364, 464 comprises valves 372, including gas valves, to control entry of first and second reactants R1, R2 into a passage 118 within a tool body 102 via at least one flow tube 124, the passage including a surface 120 and extending without interruption from an entrance end 104 of the passage 118 to an exit end 108 of the passage 118. The system 364, 464 may comprise measurement device 342 (e.g., a mass measurement device or a refractive index measurement device) coupleable to the exit end 108 to indicate the thickness of a coating 122 on the surface 120 as the first and the second reactants R1, R2 interact with the surface 120 to form the coating 122.

The system 364, 464 may also comprise a pump 352, such as a gas pump, to promote movement of the first and the second reactants R1, R2 within the passage 118 from the entrance end 104 to the exit end 108. The system 364, 464 may further comprise a sump 344, such as a screen sump or the like, to consume residual amounts of the first and the second reactants R1, R2, and byproducts of interaction between the first reactant R1 and the second reactant R2. The sump 344 may be coupled to the exit end 108 of the passage 118 and the pump 352.

As noted previously, gas valves 372 may be used to control the entry of reactants R1, R2 and a buffer B into the passage 118 within the tool body 102. In some embodiments, the gas valves 372 comprise at least three valves to separately control flow of the first reactant R1, the second reactant R2, and a buffer B into the entrance end of the passage. While only a single buffer B is shown in FIGS. 3 and 4, it should be noted that multiple buffers B having different chemical compositions may be used to separate the introduction of the reactants R1, R2 into the passage 118 (e.g., as shown in FIG. 2).

The coating process may be controlled by the processors 330, using an indication of the coating thickness for feedback. Thus, the system 364, 464 may comprise a processor 330 to control flow of at least one of the first reactant R1 and the second reactant R2 based on measurements obtained from the measurement device 342, such as a mass measurement device or a refractive index measurement device, or a combination of these.

A quartz microbalance (operating as a mass measurement device) can display a change in resonant frequency to indicate coating thickness. An ellipsometer (operating as a refractive index measurement device) can display a refractive index change of the coating to indicate coating thickness. Thus, in some embodiments, the system 364, 464 may comprise a display 396 to publish a frequency change or a refractive index change indicating the thickness of the coating.

An oven 374 may be used to raise the tool body temperature, enhancing the speed of activity for selected reactants R1, R2. Thus, in some embodiments, the system 364, 464 may comprise an oven 374 to heat the tool body 102.

In many embodiments, no vacuum chamber 482 is used to coat the passages 118 of the tool body 102. However, in some embodiments, the entire tool body 102 may be housed in a vacuum chamber 482 for outer surface coating tasks. Thus, in some embodiments, the system 364, 464 may comprise a vacuum chamber 482 to house the tool body 102.

The apparatus 100; tool body 102; entrance end 104; exit end 108; passages 112, 118; variations 114; end caps 116; surfaces 120; flow tubes 124; reactant-buffer groups 200; processors 330; logic 340; measurement device 342; sump 344; pump 346; exhaust 348; memory 350; data acquisition system 352; systems 364, 464; valves 372; oven 374; path 376; signal and data lines 378; display 396; vacuum chamber 482; buffers B, N2; and reactants R, R1, R2 may all be characterized as "modules" herein. Such modules may include hardware circuitry, and/or a processor and/or memory circuits, software program modules and objects, and/or firmware, and combinations thereof, as desired by the architect of the apparatus 100 and systems 364, 464, and as appropriate for particular implementations of various embodiments.

For example, in some embodiments, such modules may be included in an apparatus and/or system operation simulation package, such as a software electrical signal simulation package, a power usage and distribution simulation package, a power/heat dissipation simulation package, a radiation simulation and/or fluid flow package, a communications simulation package, a chemical reaction simulation package, and/or a combination of software and hardware used to simulate the operation of various potential embodiments.

It should also be understood that the apparatus and systems of various embodiments can be used in applications other than for down hole tool passage coating operations, and thus, various embodiments are not to be so limited. The illustrations of apparatus 100 and systems 364, 464 are intended to provide a general understanding of the structure of various embodiments, and they are not intended to serve as a complete description of all the elements and features of apparatus and systems that might make use of the structures described herein. Some embodiments include a number of methods.

Figure 5:
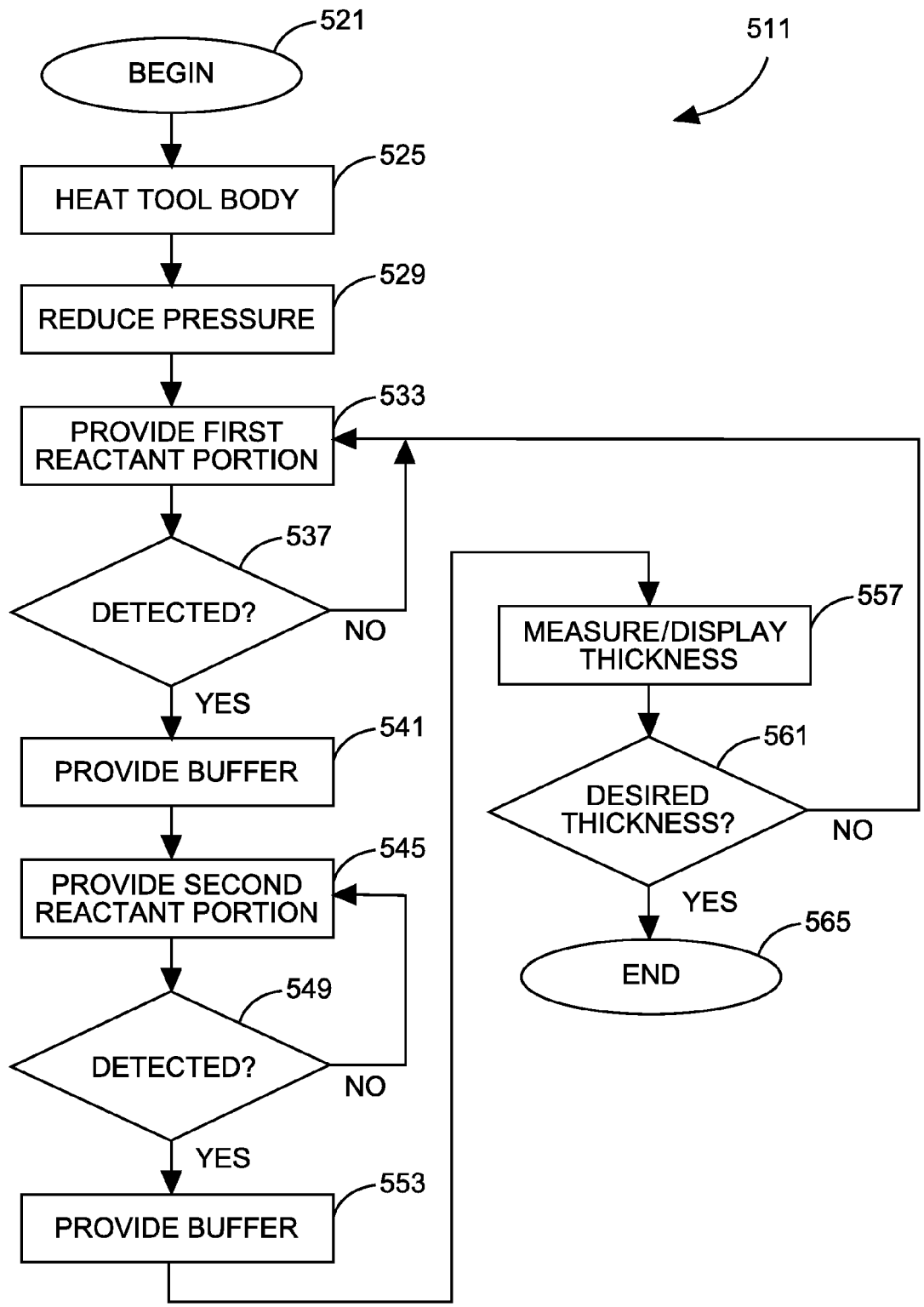
FIG. 5 is a flow chart illustrating several methods according to various embodiments of the invention.

For example, FIG. 5 is a flow chart illustrating several methods 511 according to various embodiments of the invention. The methods 511 may comprise processor-implemented methods, and may include, in some embodiments, methods for applying a coating of controlled thickness to selected tool body surfaces, such as drilled flow passages within a tool body. Other operational arrangements are possible.

Depending on the construction of the apparatus in use, the tool body passage(s) may have two closed ends (e.g., both connected to flow tubes, as shown in FIG. 3), or a closed end and an open end (e.g., one end connected to a flow tube, and the other left open, as shown in FIG. 4). The following description of a method embodiment assumes that the tool body passage to be coated has two closed ends. If the tool body passage has an open end, those of ordinary skill in the art, after reading this disclosure and studying the attached figures, will understand how the method 511 can be adapted to revise the order of activities and to mask selected areas on the tool body surfaces to prevent coating of the masked areas.

Thus, a method 511 of applying a protective coating to a surface defined by a passage within a down hole tool body may begin at block 521. The method 511 may continue on to block 525 with heating the tool body, perhaps to enhance the speed of coating thickness development. Thus, the activity at block 525 may comprise heating the tool body to a temperature of about 25° C. to about 200° C. prior to providing the first quantity of reactant to the passage within the tool body.

Pressure within the tool body may be reduced (e.g., using a vacuum pump) to encourage the flow of reactants from one end of the tool body to the other. Thus, the method 511 may continue on to block 529 to include reducing pressure within the passage contained within the tool body to promote flow of at least one of the first reactant or the second reactant from the entrance end to the exit end of the passage.

The method 511 may continue on to block 533 to include providing a first quantity of the first reactant as a gas that flows under reduced atmospheric pressure to interact with a surface of a tool body, so that the interaction is confined to a passage within the tool body. The passage includes the surface, and the passage extends without interruption from the entrance end of the passage to the exit end of the passage. When an open-ended passage is coated, it is possible to coat an outer surface of the tool body at substantially the same time.

As noted previously, portions of the tool body surfaces can be masked off to prevent interaction with the reactants. Thus, the activity at block 533 may comprise providing the first quantity of the first reactant to interact with the surface of the passage, except for a masked portion of the surface to prevent forming the coating on the masked portion. Portions of the outer surface of the tool body can also be masked off.

Flow tubes can be used to couple the reactants directly to the tool body, including to a passage within the tool body. Thus, the activity at block 533 may comprise flowing the gas into a flow tube coupled to the passage.

If the quantity of the first reactant to be used in the process is not yet known, and the presence of the first reactant is not detected at the exit end of the passage (e.g., using a measurement device described previously) at block 537, then the method 511 may include returning to block 533, so that more of the first reactant can be provided. If the desired total quantity of the first reactant has been introduced into the passage, as determined by quantity measurement, or detection at block 537, then the method 511 may continue on to block 541.

Thus, in some embodiments, the first reactant may be provided at one end of the passage, until its presence is detected at the other end. Therefore, the activity at block 533 may comprise providing the first quantity until presence of the first reactant is indicated proximate to the exit end of the passage using a mass measurement or an index of refraction measurement.

A buffer may be used to purge the first reactant from a portion of the passage, or the entire passage, prior to the introduction of the second reactant. Thus, the method 511 may continue on to block 541 to include providing a buffer under reduced atmospheric pressure subsequent to the first reactant, and prior to the second reactant, to substantially purge the first reactant from at least a portion of the passage.

The method 511 may continue on to block 545 to include providing a second quantity of a second reactant as a gas under reduced atmospheric pressure, subsequent to the first quantity of the reactant, to interact with the surface of the tool body passage. Early in the process, instead of providing the entire quantity of the second reactant all at once, the second reactant can be provided in a series of smaller amounts while the exit end of the passage is monitored for presence of the second reactant, to determine when the passage has been coated using the second reactant and thus, an optimal total amount of the second reactant that is sufficient to coat the desired surface. In other words, the smaller amounts of the second reactant, each taken alone, are less than what is needed to coat the entire surface of the tool body passage that has already been coated by the first reactant. However, once the presence of the second reactant is detected, the total amount of the second reactant used to accomplish coating will be the sum of the smaller amounts. Thus, the activity at block 545 may comprise providing a portion of the second quantity in an amount insufficient to coat a portion of the surface that has interacted with the first quantity.

Many reactants can be used. A partial list includes one or more of the following: an aluminum compound, a barium compound, a cadmium compound, a carbon compound, a chromium compound, a cobalt compound, a copper compound, a gallium compound, a gold compound, an indium compound, an iron compound, a magnesium compound, a nickel compound, an oxygen compound, a platinum compound, a silicon compound, a silver compound, a tin compound, a titanium compound, a vanadium compound, or a zinc compound.

The method 511 may continue on to block 549 to include providing a total amount of the second quantity of reactant by repeatedly providing an additional amount of the second quantity until presence of the second reactant is indicated proximate to the exit end of the passage (e.g., via direct coupling of a measurement device to the exit end of the passage, per FIG. 3, or via indirect coupling of the measurement device to the exit end of the passage, per FIG. 4).

In some embodiments, the method 511 may continue on to block 553 to provide a buffer after the total amount of the second quantity of the reactant has been introduced into the passage. The composition of the buffer provided as part of the activity in block 553 may be the same as, or different from, the buffer provided as part of the activity in block 541.

In some embodiments, the method 511 may continue on to block 557 to include determining the thickness of the coating, which may comprise one or more atomic monolayers. The activity at block 557 may include publishing (e.g., via workstation display, hardcopy printout, or nonvolatile memory storage) the indicated or approximate thickness of the coating.

The method 511 may continue on to block 561 to determine whether the desired coating thickness has been achieved. If not, then the method 511 may comprise returning to block 533, to include repeating providing the first quantity and the second quantity of the reactants (and buffers, if desired) until a selected coating thickness on the surface is formed.

As noted previously, the coating thickness may be determined by the number of monolayers that have been formed. Thus, the first and second reactants may be provided repeatedly to form the coating as a selected number of monolayers to obtain the selected thickness.

Repeating groups of reactants, separated by one or more buffers, can be deployed along the distance of the passage, from the entrance end to the exit end. Thus, the repetition of activity within the method 511 may comprise repeatedly sending a series of groups through the passage, the groups comprising the first reactant, a buffer, the second reactant, and the same buffer, or a different buffer.

Once the desired coating thickness has been achieved, the method 511 may end at block 565.

It should be noted that the methods described herein do not have to be executed in the order described, or in any particular order. Moreover, various activities described with respect to the methods identified herein can be executed in iterative, serial, or parallel fashion. The various elements of each method (e.g., the methods shown in FIG. 5) can be substituted, one for another, within and between methods. Information, including parameters, commands, operands, and other data, can be sent and received in the form of one or more carrier waves.

Upon reading and comprehending the content of this disclosure, one of ordinary skill in the art will understand the manner in which a software program can be launched from a computer-readable medium in a computer-based system to execute the functions defined in the software program. One of ordinary skill in the art will further understand the various programming languages that may be employed to create one or more software programs designed to implement and perform the methods disclosed herein. The programs may be structured in an object-orientated format using an object-oriented language such as Java or C#. In another example, the programs can be structured in a procedure-orientated format using a procedural language, such as assembly or C. The software components may communicate using any of a number of mechanisms well known to those skilled in the art, such as application program interfaces or inter-process communication techniques, including remote procedure calls. The teachings of various embodiments are not limited to any particular programming language or environment. Thus, other embodiments may be realized.

Figure 6:
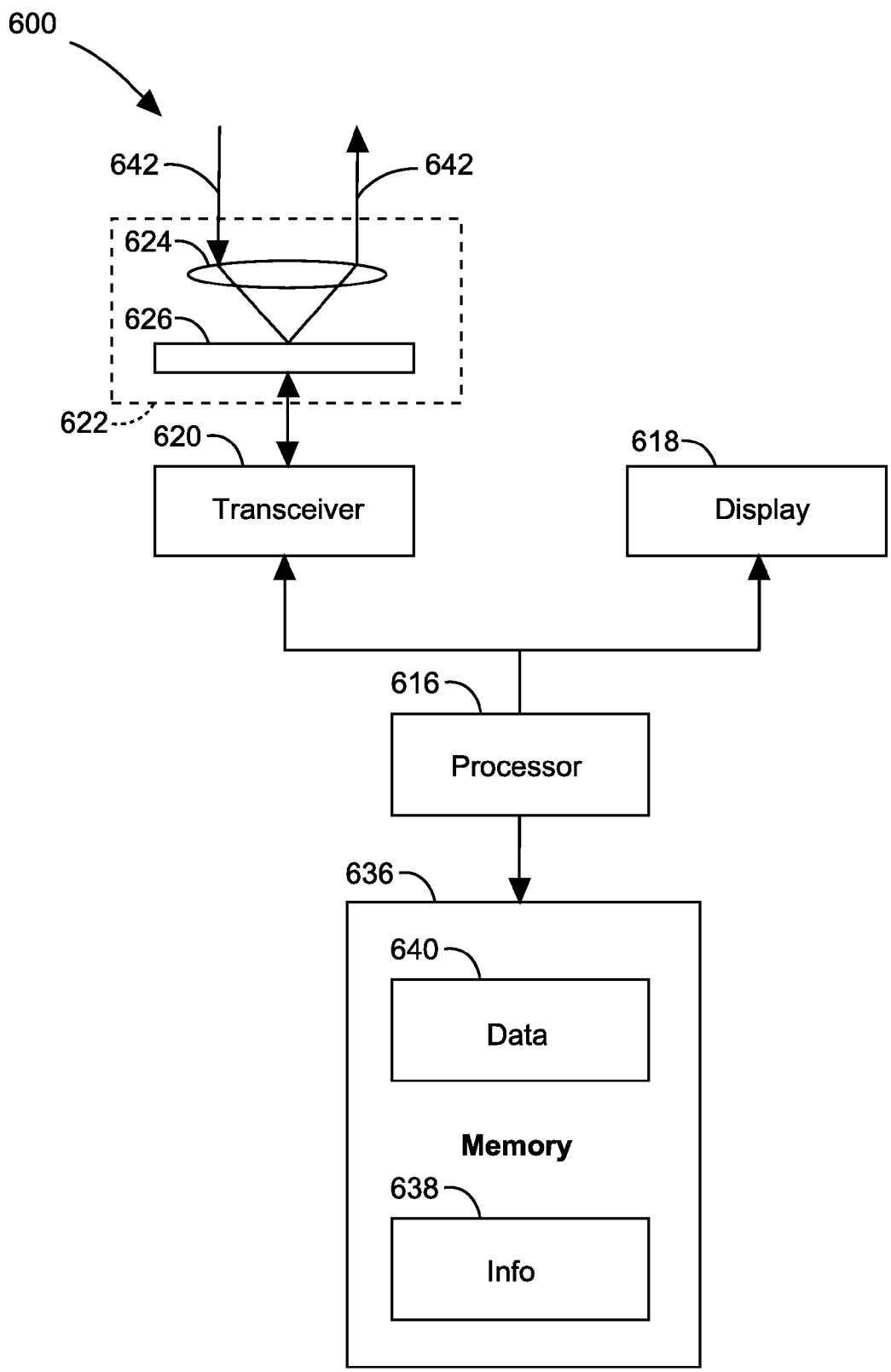
FIG. 6 is a block diagram of an article according to various embodiments of the invention.

For example, FIG. 6 is a block diagram of an article 600 according to various embodiments of the invention, such as a computer, a memory system, a magnetic or optical disk, or some other storage device. The article 600 may include one or more processors 616 coupled to a machine-accessible medium such as a memory 636 (e.g., removable storage media, as well as any tangible, non-transitory memory including an electrical, optical, or electromagnetic conductor) having associated information 638 (e.g., computer program instructions and/or data), which when executed by one or more of the processors 616, results in a specific machine (e.g., the article 600) performing any actions described with respect to the methods of FIG. 5, the apparatus of FIG. 1, and/or the systems 364, 464 of FIGS. 3 and 4. The processors 616 may comprise one or more processors sold by Intel Corporation (e.g., Intel® Core™ processor family), Advanced Micro Devices (e.g., AMD Athlon™ processors), and other semiconductor manufacturers.

In some embodiments, the article 600 may comprise one or more processors 616 coupled to a display 618 to display data processed by the processor 616 and/or a wireless transceiver 620 (e.g., a local transmitter coupled to a data acquisition system) to receive and transmit data processed by the processor to another (remote) system.

The memory system(s) included in the article 600 may include memory 636 comprising volatile memory (e.g., dynamic random access memory) and/or non-volatile memory. The memory 636 may be used to store data 640 processed by the processor 616.

In various embodiments, the article 600 may comprise communication apparatus 622, which may in turn include amplifiers 626 (e.g., preamplifiers or power amplifiers) and one or more antenna 624 (e.g., transmitting antennas and/or receiving antennas). Signals 642 received or transmitted by the communication apparatus 622 may be processed according to the methods described herein.

Many variations of the article 600 are possible. For example, in various embodiments, the article 600 may comprise a data acquisition and processing system, including the apparatus 100 shown in FIG. 1. In some embodiments, the article 600 is similar to or identical to portions of the systems 364, 464 shown in FIGS. 3 and 4.

Using the apparatus, systems, and methods disclosed herein may enable cost-effective coating of passages within large objects, such as down hole tool bodies, that are difficult to access using prior art methods. The application of a protective, holiday free coating may provide a number of advantages, such as reducing $H_2S$ adsorption in the tool. Another advantage may include reducing the tendency to form abrasive surfaces, which in turn may reduce cable wear and the potential for arcing. Increased customer satisfaction may result.

The accompanying drawings that form a part hereof, show by way of illustration, and not of limitation, specific embodiments in which the subject matter may be practiced. The embodiments illustrated are described in sufficient detail to enable those skilled in the art to practice the teachings disclosed herein. Other embodiments may be utilized and derived therefrom, such that structural and logical substitutions and changes may be made without departing from the scope of this disclosure. This Detailed Description, therefore, is not to be taken in a limiting sense, and the scope of various embodiments is defined only by the appended claims, along with the full range of equivalents to which such claims are entitled.

Such embodiments of the inventive subject matter may be referred to herein, individually and/or collectively, by the term "invention" merely for convenience and without intending to voluntarily limit the scope of this application to any single invention or inventive concept if more than one is in fact disclosed. Thus, although specific embodiments have been illustrated and described herein, it should be appreciated that any arrangement calculated to achieve the same purpose may be substituted for the specific embodiments shown. This disclosure is intended to cover any and all adaptations or variations of various embodiments. Combinations of the above embodiments, and other embodiments not specifically described herein, will be apparent to those of skill in the art upon reviewing the above description.

The Abstract of the Disclosure is provided to comply with 37 C.F.R. §1.72(b), requiring an abstract that will allow the reader to quickly ascertain the nature of the technical disclosure. It is submitted with the understanding that it will not be used to interpret or limit the scope or meaning of the claims. In addition, in the foregoing Detailed Description, it can be seen that various features are grouped together in a single embodiment for the purpose of streamlining the disclosure. This method of disclosure is not to be interpreted as reflecting an intention that the claimed embodiments require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

What is claimed is:

1. A method, comprising:
providing a first quantity of a first reactant as a gas that flows under reduced atmospheric pressure to interact with a surface of a tool body by atomic layer deposition, the interaction confined to a passage within the tool body, the passage including the surface and extending without interruption from an entrance end of the passage to an exit end of the passage, the first quantity of the first reactant provided in a train of gas components;
providing a second quantity of a second reactant as a gas under the reduced atmospheric pressure, subsequent to the first quantity, to interact with the surface of the tool body, the second quantity of the second reactant provided in the train of gas components; and
repeating providing the first quantity and the second quantity until a selected thickness of a coating on the surface is formed.

2. The method of claim 1, wherein providing the first quantity comprises:
providing the first quantity of the first reactant to interact with the surface, except for a masked portion of the passage to prevent forming the coating on the masked portion.

3. The method of claim 1, wherein providing the first quantity comprises:
flowing the gas into a flow tube coupled to the passage.

4. The method of claim 1, wherein at least one of the first reactant or the second reactant is selected from a group consisting of an aluminum compound, a barium compound, a cadmium compound, a carbon compound, a chromium compound, a cobalt compound, a copper compound, a gallium compound, a gold compound, an indium compound, an iron compound, a magnesium compound, a nickel compound, an oxygen compound, a platinum compound, a silicon compound, a silver compound, a tin compound, a titanium compound, a vanadium compound, and a zinc compound.

5. The method of claim 1, wherein the coating comprises a substantially holiday free coating.

6. The method of claim 1, wherein the tool body comprises a metal, and wherein the coating comprises an oxide.

7. The method of claim 1, further comprising:
heating the tool body to a temperature of about 25° C. to about 200° C. prior to providing the first quantity.

8. The method of claim 1, further comprising:
providing a buffer under the reduced atmospheric pressure subsequent to the first reactant and prior to the second reactant to substantially purge the first reactant from at least a portion of the passage.

9. The method of claim 1, wherein the repeating comprises:
forming the coating as a selected number of monolayers to obtain the selected thickness.

10. The method of claim 1, further comprising:
reducing pressure within the passage to promote flow of at least one of the first reactant or the second reactant from the entrance end to the exit end.

11. The method of claim 1, wherein the repeating comprises:
repeatedly sending a series of groups through the passage, the groups comprising the first reactant, a buffer, the second reactant, and the buffer.

12. A method, comprising:
providing a first quantity of a first reactant as a gas that flows under reduced atmospheric pressure to interact with a surface of a tool body, the interaction confined to a passage within the tool body, the passage including the surface and extending without interruption from an entrance end of the passage to an exit end of the passage, wherein providing the first quantity comprises providing the first quantity until presence of the first reactant proximate to the exit end is indicated, using a mass measurement or an index of refraction measurement;
providing a second quantity of a second reactant as a gas under the reduced atmospheric pressure, subsequent to the first quantity, to interact with the surface of the tool body; and repeating providing the first quantity and the second quantity until a selected thickness of a coating on the surface is formed.

13. A method, comprising:
providing a first quantity of a first reactant as a gas that flows under reduced atmospheric pressure to interact with a surface of a tool body, the interaction confined to a passage within the tool body, the passage including the surface and extending without interruption from an entrance end of the passage to an exit end of the passage;
providing a second quantity of a second reactant as a gas under the reduced atmospheric pressure, subsequent to the first quantity, to interact with the surface of the tool body; and repeating providing the first quantity and the second quantity until a selected thickness of a coating on the surface is formed, wherein providing the second quantity comprises:
first providing a portion of the second quantity in an amount insufficient to coat a portion of the surface that has interacted with the first quantity; and
second providing a total amount of the second quantity by repeatedly providing an additional amount of the second quantity until presence of the second reactant is indicated proximate to the exit end.

* * * * *